United States Patent [19]

Matsuno

[11] Patent Number: 5,850,102
[45] Date of Patent: Dec. 15, 1998

[54] SEMICONDUCTOR DEVICE HAVING A SECOND INSULATING LAYER WHICH INCLUDES CARBON OR FLUORINE AT A DENSITY LOWER THAN A FIRST INSULATING LAYER

[75] Inventor: Tadashi Matsuno, Kanagawa-ken, Japan

[73] Assignee: Kabushiki Kaisha Toshiba, Kawasaki, Japan

[21] Appl. No.: 831,967

[22] Filed: Apr. 2, 1997

[30] Foreign Application Priority Data

Apr. 3, 1996 [JP] Japan .................................... 8-081541

[51] Int. Cl.[6] .................................................... H01L 23/58
[52] U.S. Cl. ........................................... 257/635; 257/760
[58] Field of Search .................................. 257/760, 762, 257/751, 635, 632

[56] References Cited

U.S. PATENT DOCUMENTS

| | | | |
|---|---|---|---|
| 5,521,424 | 5/1996 | Ueno et al. | 257/632 |
| 5,592,024 | 1/1997 | Aoyama et al. | 257/751 |
| 5,661,334 | 8/1997 | Akram | 257/760 |

*Primary Examiner*—Olik Chaudhuri
*Assistant Examiner*—Nathan Kelley
*Attorney, Agent, or Firm*—Finnegan, Henderson, Farabow, Garrett & Dunner, L.L.P.

[57] ABSTRACT

This invention is related to a metallization of Cu.

The semiconductor device comprises a first insulating layer having a groove in a surface thereof, a second insulating layer on a surface of the groove, made of a material having a low density of crystal defects in comparison with that of the first insulating layer, and a wiring layer buried in the groove, surrounded by the second insulating layer.

26 Claims, 5 Drawing Sheets

SEMICONDUCTOR DEVICE HAVING A SECOND INSULATING LAYER WHICH INCLUDES CARBON OR FLUORINE AT A DENSITY LOWER THAN A FIRST INSULATING LAYER

FIELD OF THE INVENTION

The present invention relates to a metallization of Copper.

BACKGROUND OF THE INVENTION

In manufacturing semiconductor devices such as VLSI, etc., the wiring technology is a very important. Wiring is also important in the development of devices such as transistors. Cu (copper) has less resistance than Al (aluminum) which has been used most frequently, and hardly generates problems such as electro-migration. From this feature, the Cu wiring has a characteristic of higher reliability than the Al wiring. Efforts have therefore been made to increase the use of Cu as a wiring material in recent years.

However, when Cu or a metal containing Cu is used as a wiring material, Cu is diffused in an interlayer insulating layer (normally composed of a silicone oxide film) and this diffused Cu causes a problem of current leakage between wires. Therefore, to prevent diffusion of Cu that is used as a wiring material, it is necessary to cover the surface of Cu wire with a metal having a high melting point such as titanium (Ti) or tungsten (W) as a barrier metal layer.

One example of a conventional wire using Cu is shown in FIG. 1. A wiring layer 6 comprising Cu was formed in an interlayer insulating layer 2 on a semiconductor substrate 1. This wiring layer 6 is buried in a wiring groove 3 that was formed in the interlayer insulating layer 2. Further, a barrier metal layer 5 was formed by a metal film having a high melting point, such as TiN, between the wiring layer 6 and the interlayer insulating layer 2. This barrier metal layer 5 is formed on the inner wall surface of the wiring groove 3 before it is buried in the wiring layer 6 after, opening the wiring groove 3. Further, in FIG. 1 the barrier metal layer was not formed on the wiring layer 6, but the diffusion of Cu can be prevented by forming a dense insulating film 8 of, for instance, SiN, etc.

On the other hand, as a result of the high integration of semiconductor devices in recent years, a distance between the wiring layer 6 and an adjacent wiring layer (not shown) has become shorter. Because of this closer spacing, a capacitance component between these wiring layers cannot be disregarded. To reduce the effect of this increased capacitance component, it becomes necessary to use an insulating film having a low dielectric constant as an interlayer insulating layer.

Here, it is known that this dielectric constant of the interlayer insulating film 2 can be reduced to, for example, 3.0–3.5 from 3.9 of an oxide film by using a silicon dioxide ($SiO_2$) mixed with fluorine as the interlayer insulating film 2. Because of this, a process to form an oxide film containing fluorine as the interlayer insulating layer 2 was tried using a plasma-CVD process.

However, fluorine (F) contained in the interlayer insulating layer 2 has a nature that tends to react with Ti, contained particularly in the barrier metal layer 5. Therefore, The problem arises that the quality of the barrier metal layer 5 changes, its nature as a barrier against Cu deteriorates, and Cu may diffuses into the interlayer insulating layer 2.

Further, the oxide film containing F formed according to the plasma-CVD process is composed of not only combined groups of Si-O and Si-F, but also combined groups of Si-CxFy, Si-HxFy and Si-OH. Here, combined groups of Si-F, Si-CxFy, Si-HxFy and Si-OH have a lower combined energy than that of a combined group of Si-O. Therefore, if an energy by heat treatment is added, -F, -CxFy, -HxFy and -OH are easily disassociated from Si-radical and react with the barrier metal layer 5. As a result, the problem arises that the nature of the barrier metal layer 5 as a barrier for wiring layer materials is deteriorated as described above.

Further, as a material for an interlayer insulating layer having a low dielectric constant, it is possible to use organic materials for insulating film using, for example, SOG (Spin-On-Glass), etc.. However, as in the case when silicon oxide containing fluorine described above is used as a material for the interlayer insulating layer, this insulating membrane reacts easily with a metal comprising the barrier metal layer 5, for instance, Ti, and therefore the problem arises that Cu is diffused in the interlayer insulating layer 2.

In addition, there is a possibility that C(carbon) may mix in the interlayer insulating layer 2 from raw material gas, and the interlayer insulating layer 2 may have a combined radical containing C during the manufacturing process to form wirings. As a result, the problem arises that the nature of the barrier metal layer 5 as a barrier may be deteriorated because this combined radical containing C easily reacts with a metal comprising the barrier metal layer 5 in the same manner as the combined radical containing fluorine described above.

Thus, when an insulating material having a low dielectric constant is used as an interlayer insulating layer and a metal containing Cu made with the conventional manufacturing process is used as a wire structure, there was a problem that the barrier metal layer for preventing diffusion of Cu into the interlayer insulating layer reacted with the interlayer insulating layer material, and the nature of the barrier metal layer was deteriorated.

SUMMARY OF THE INVENTION

It is an object of the present invention to prevent material of the wiring layer from diffusing into the interlayer insulating layer.

To achieve the above object, the present invention provides a semiconductor device comprising a first insulating layer having a groove in a surface thereof, a second insulating layer on a surface of the groove made of a material having a low density of crystal defect in comparison with that of the first insulating layer, and a wiring layer buried in the groove surrounded by the second insulating layer.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWING

A more complete appreciation of the present invention and many of its attendant advantages will be readily obtained by reference to the following detailed description considered in connection with the accompanying drawings, in which.

DETAILED DESCRIPTION OF PREFERRED EMBODIMENTS

Embodiments of the present invention will be described in detail with reference to the drawings.

Figure 2A:
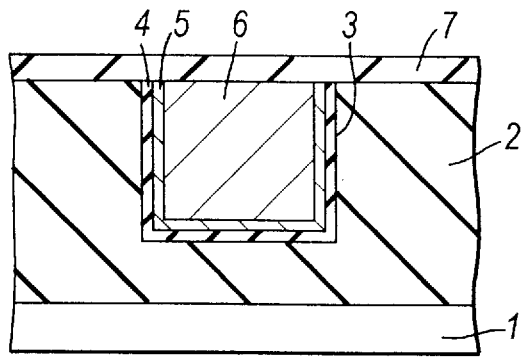
FIGS. 2(a) and 2(b) are sectional views of structures of a semiconductor device according to a first embodiment.
Figure 2B:
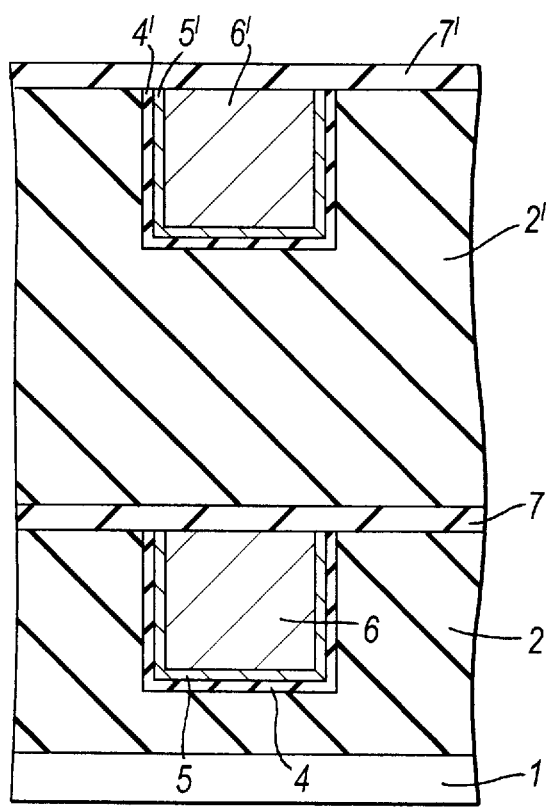

FIGS. 2(a) and 2(b) are sectional views illustrating the structure of a semiconductor device according to the first embodiment of the present invention. FIG. 2(a) illustrates a semiconductor device having a single wiring layer and FIG. 2(b) illustrates a semiconductor device having double wiring layers.

As illustrated in FIGS. 2(a) and 2(b), in case of a semiconductor device according to this embodiment, the wiring layer 6 composed of, for instance, an alloy of Cu or Al and Cu, etc. or a metal containing Cu is buried in the interlayer insulating layer 2 on the semiconductor substrate 1 in the same manner as before. Further, although not shown in FIG. 2, semiconductor devices such as transistors are formed on the semiconductor substrate 1. These semiconductor devices and the wiring layer 6 are separated by the interlayer insulating layer 2. This interlayer insulating layer 2 is composed of an insulating film having a lower dielectric constant such as silicon oxide, etc., containing fluorine in the same manner as before. Further, to prevent Cp contained in this wiring layer 6 from diffusing in the interlayer insulating layer 6, the surface of the wiring layer 6 is covered by the barrier metal layer 5 composed of a material such as, TiN.

Further, differing from a conventional semiconductor device where the barrier metal layer 5 and the interlayer insulating layer 2 were in direct contact with each other, on a semiconductor device according to this embodiment, an insulating layer 4 about 50 nm thick is formed between the barrier metal layer 5 and the interlayer insulating layer 2. This insulating layer 4 is composed of silicon oxide or silicone nitride. The content or density of carbon or fluorine contained in this insulating film 4 is less than that of the interlayer insulating layer 2.

Further, in this embodiment, an insulating layer 7 about 50 nm thick of silicon oxide or silicon nitride having less content of C (carbon) or F (fluorine), than the insulating layer 4, is formed on the wiring layer 6.

As described above, on a semiconductor device according to this embodiment, the insulating layer 4 using a material differing from the interlayer insulating layer 2 is formed between the barrier metal layer 5 and the interlayer insulating layer 2. Importantly, the insulating layer 4 contains less C or F than the interlayer insulating layer 2. In general, an insulating film having a low content of C or F has a low defective density in the insulating film and hardly reacts with metals such as TiN, etc. comprising the barrier metal layer 5. It is therefore possible to suppress the reaction of the barrier metal layer with the insulating film, in comparison with a conventional semiconductor device wherein the interlayer insulating layer 2 having a high content of C or F is directly in contact with the barrier metal layer 5.

Further, by using an HDP (High Density Plasma)—CVD for forming this insulating film, stable film having even fewer defects can be obtained. It is therefore possible to prevent Cu contained in the wiring layer 6 from diffusing into the interlayer insulating layer 2 while maintaining the barrier characteristic of the barrier metal layer 5. Thus, it becomes possible to prevent the current leakage between the wiring layer 5 and adjacent wiring layers that is caused by Cu diffused into the interlayer insulating layer. 2.

Further, if the reaction of the interlayer insulating layer 2 with the barrier metal layer 5 can be prevented, the insulating layer 4 in any film thickness is sufficient. A required minimum film thickness depends on the film quality of the insulating layer 4 and the temperature of a heat treatment after forming the barrier metal layer 5. The better the film quality of the insulating layer 4 and the lower the heat treatment temperature, the thinner the film thickness of the insulating film 4 can be made. For instance, when the barrier metal layer 5 is formed by performing the sputtering or melting of Cu with a laser beam at about 400° C., and the pressure and non-oxidizing atmosphere reduced after forming it, a heat treatment at about 550° C. will become necessary. On the other hand, when Cu is formed according to the CVD process, the CVD is carried out at a temperature of about 350° C. Therefore, it is possible to make the film thickness of the insulating layer 4 thin, The width of the wiring groove 3 shows a tendency to become narrower as a result of the high integration. Here, in order to prevent on increase in the resistance of the wiring layer 6 formed inside the wiring groove 3 of narrow width, the width of the wiring layer 6 must be secured. It is therefore desirable that the film thickness of the insulating layer 4 be thin.

Further, the content of C or F less than that of the interlayer insulating layer 2 has a meaning as shown below in this embodiment. That is, when forming the interlayer insulating layer 2, C and F are intentionally add to the interlayer insulating layer 2 by mixing is gases such as $C_2F_6$. On the other hand, when forming the insulating layer 4, no such operation is performed. The difference in the content of C or F in both layers can be attributed to the above reason.

As a variation of the embodiment described above, there is a multi-layer wiring structure having more than two wiring layers as illustrated in FIG. 2(b). In this figure, by forming the insulating layer 5 between the wiring layer 6 and the barrier metal layer 4, this embodiment becomes applicable.

Figure 3A:
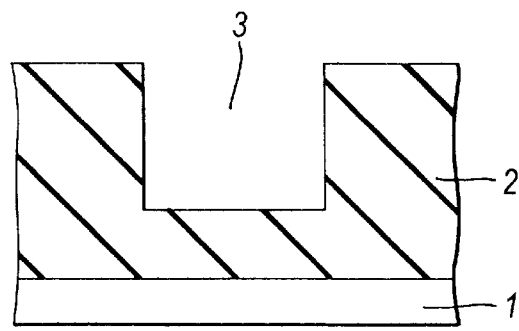
FIGS. 3(a), 3(b), and 3(c) are sectional views of each step of manufacturing the semiconductor device according to the first embodiment.
Figure 3B:
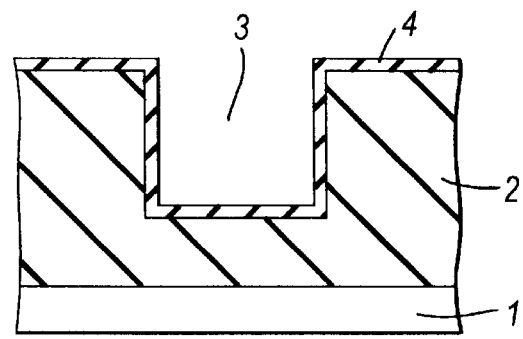
Figure 3C:
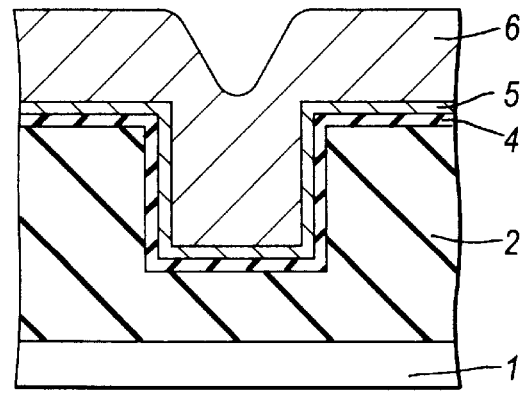

FIGS. 3(a), 3(b), and 3(c) are sectional views illustrating a manufacturing process for the first embodiment of the semiconductor device of the present invention.

First, a semiconductor device such as a MOSFET, etc. is formed on the semiconductor substrate 1. Then, silicon oxide containing fluorine is deposited on this semiconductor device in, for instance, 0.8 μm according to such a process as Plasma-CVD as the interlayer insulating layer 2 having a low dielectric constant.

Here, the low dielectric constant in this invention denotes a dielectric constant lower than a dielectric constant of 3.90 of a thermal film oxide.

Further, it is possible to form such an interlayer insulating layer 2 containing fluorine using, for instance, TEOS (Tetraethoxysilane) and $O_2$ as raw gas and mixing $C_2F_6$ into them using a parallel flat type plasma apparatus, etc. The insulating film thus formed has a dielectric constant of 3.6.

Further, it is also possible to use $SiH_4$ instead of the TEOS, and $O_2$ instead of $O_2$ as the raw material gases. In addition, the gas that is used for adding F is not only $C_2F_6$ but also such gases as, for instance, $NF_3$, $CF_4$, $C_4F_8$, $SiF_4$. Further, a mixed gas of $SiF_4$ gas and $O_2$ gas is also usable.

Further, as an apparatus for forming the interlayer insulating layer 2, such film forming apparatuses equipped with a high density plasma generator, such as ECT (Electron Cyclotron Resonance), Helicon (Helicon Wave Excited Plasma), ICP (Inductively Coupled Plasma), etc. can be used, in addition to the parallel flat type plasma-CVD apparatus. When using these apparatuses, an inert gas such as Ar etc. may be added for the purpose of giving a bias etching component when forming a film.

Then, resist is deposited on the interlayer insulating layer 2 and an etching mask is formed by removing resist in the area where a wiring groove is planned according to a Risography process. Thereafter, using this etching mask, the wiring groove 3 is formed in the wiring area on the interlayer insulating layer 2 according to such an etching technology such as RIE (Reactive Ion Etching)(FIG. 3(a)). Here, on the exposed side wall surfaces and bottom surface of the wiring groove, such unstable combined radicals as Si-F or -CxFy, -HxFy, -OH, etc. are exposed as before. Further, semiconductor devices such as transistors, etc. on the semiconductor substrate 1 are omitted in this figure as in FIGS. 2(a) and 2(b).

Hereafter, a first insulating layer 4 having a lower dielectric constant and a lower density of C and F than the interlayer insulating layer 2 is formed in a film thickness of 5 nm on the side wall and bottom surfaces of the wiring groove 3 as illustrated in FIG. 3(b). This differs from the conventional practice where the barrier metal layer was directly formed on the side wall and bottom surfaces of the wiring groove 3 including the unstable combined groups. The first insulating layer 4 can thus be formed using $SiH_4$ and $O_2$ as raw materials an ICP type high density plasma apparatus. Further, it is also possible to use ECR, or Helicon, etc., as a high density plasma apparatus. In addition, when the first insulating layer 4 is formed in this manner, the film thickness formed on the inner wall surface of the wiring groove tends to become thinner than the film thickness formed on the interlayer insulating layer 2. This can be rectified using a conformal insulating layer formed through TEOS deposition at reduced pressure.

Then, a metallic film containing a metal having a high melting point such as Tin or WSiN is formed as the barrier metal layer 5 in a film thickness of about 30 nm on the first insulating layer 4, as illustrated in FIG. 3(c). Further, the wiring material 6 containing Cu or Al-Cu is formed in about 1.0 μm so that the inside of the wiring groove 3 is completely filled using a film forming technology, for instance, by performing the sputtering at about 400° C., at a reduced pressure and in a non-oxidized atmosphere.

In addition to the sputtering process, it is possible to fill the wiring groove 3 with wiring 6 by completely burying Cu in the wiring groove 3 by melting Cu using a laser beam after depositing Cu in the wiring groove by CVD, or by completely burying Cu in the wiring groove 3 by molting Cu through heat treatment in a high tension chamber.

Hereafter, the height of the surface of the wiring material 6 remaining in the inside of the wiring groove 3 is made almost equal to the height of the surface of the interlayer insulating layer 2 by polishing and removing the barrier metal layer 5 and the wiring material 6 on the surface of the interlayer insulating layer 2 other than the wiring groove 3 using a technology such as CMP (Chemical Mechanical Polishing). At this time, it is also possible to polish all of the insulating layer 4 on the interlayer insulating layer 2 or leave it.

Hereafter, a wiring groove burying type metal wiring is completed by forming a second insulating layer 7 of, for instance, silicon oxide or silicon nitride on the flat interlayer insulating layer 2 and the wiring layer 6. The second insulating layer 7 is about, for instance, 50 nm thick as is likewise the insulating layer 4 illustrated in FIG. 2(a). Thereafter, it is possible to form a semiconductor device having more than two wiring layers as illustrated in FIG. 2(b) by repeating the steps described above as necessary.

The semiconductor device manufacturing process according to this embodiment provides the insulating layer 4, having a lower content of C and F than the interlayer insulating layer 2. The insulating layer 4 is formed between the barrier metal layer 5 and the interlayer insulating layer 2 using a high density plasma apparatus. In this embodiment metals having a high melting point such as TiN, WSiN, etc. can be used. In addition to these, such high melting point metals as W system, Ta system, Nb system, Ni system, etc., are also usable.

In general, when a high density plasma apparatus is used, it is possible to decompose the greater part of the raw material of the first insulating film 4 into ions in a very simple Structure. Therefore, in the case of the first insulating film 4 which is formed by such ions in a simple structure, the possibility for terminating the Si atomic terminal in the active combined radical state becomes low. As a result, the first insulating film 4 becomes a structure having a more stable Si-C combined radical than it would otherwise have if a high density plasma apparatus is not used. Because of this, it becomes possible to form an insulating film having a lower C or F content than that of, for instance, the interlayer insulating layer 2. Further, the defective density of such an insulating film having a lower C or F content becomes generally very low. The barrier metal layer 5 hardly reacts with the first insulating film when compared to the reaction of the barrier metal layer 5 with the first insulating film. Thus, it becomes possible to maintain the barrier characteristic of the barrier metal layer 5 and prevent the diffusion of Cu in the interlayer insulating layer 2.

Next, a second embodiment of the semiconductor device manufacturing process of the present invention will be described referring to FIGS. 4(a), 4(b), and 4(c).

Figure 4A:
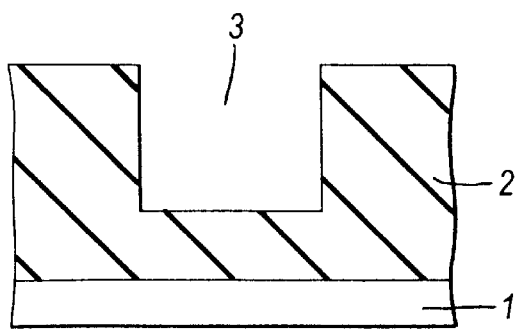
FIG. 4(a), 4(b), and 4(c) are sectional views of each step of manufacturing a semiconductor device according to a second embodiment.

As illustrated in FIG. 4(a), the steps leading to the formation of the interlayer insulating layer 2 having a low dielectric constant on the semiconductor substrate 1 and the wiring groove 3 in this interlayer insulating film 2 are the same as those in the first embodiment. On the exposed side wall and bottom surfaces of the wiring groove 3, such unstable combined radicals as Si-F or -CxFy, -OH, etc. are exposed as before.

Figure 4B:
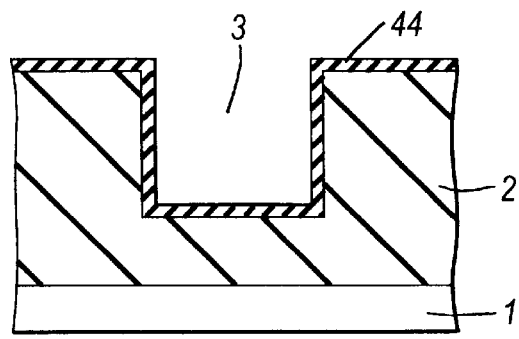

Thereafter, differing from the practice in the past of directly forming the barrier metal layer on the side wall and bottom surfaces of the wiring groove 3 including these unstable combined radicals, the plasma process is applied to the side wall and bottom surfaces of the wiring groove 3 at reduced pressure with, for example, $NH_3$ introduced in this embodiment as illustrated in FIG. 4(b). As a result, it becomes possible to change the quality (or decrease the number of unstable combined radicals) of the area to the depth of 5 nm from the side wall surface and the depth of 5 nm from the bottom surface of the wiring groove 3. The fluorine content of this quality changed layer 44 is lower than that of the rest of interlayer insulating film 2.

Figure 4C:
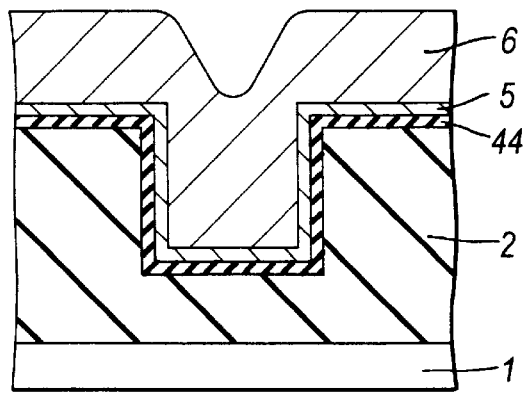

Thereafter, the first insulating layer 4 is formed on the quality changed layer 44; the barrier metal layer 5 is formed on the first insulating layer 4; and the wiring layer 6 is formed on the barrier metal layer 5, as in the first embodiment as illustrated in FIG. 4(c). Lastly, the second insulating layer 7 is formed in, for instance, 50 nm on the wiring layer 6, thus completing the wiring groove burying type metallic wiring.

As described above, the semiconductor device manufacturing process of this embodiment provides the quality changed layer 44 having a lower C and F content than of the interlayer insulating layer 2. The quality changed layer 44 is formed between the barrier metal layer 5 and the interlayer insulating layer 2 by changing the quality of the surface of the interlayer insulating layer 2 by applying the plasma process under the $NH_3$ atmosphere. This quality changed layer 44 suppresses the diffusion of wiring material into the interlayer insulating layer 2.

Further, in this embodiment the plasma process is applied to the surface of the interlayer insulating film 2 in the $NH_3$ atmosphere, but this plasma process may be applied to the surface of the interlayer insulating film 2 in the $O_3$ atmosphere. In this case, the surface of the interlayer insulating film 2 is changed in quality, and it becomes a dense $SiO_2$ having a reduced fluorine density. The quality changed layer generated in this process also suppresses the diffusion of wiring material in the interlayer insulating layer 2 as in the quality changed layer 44.

In the first and second embodiments described above, the interlayer insulating layer 2 having a low dielectric constant was formed through TEOS thermal decomposition. In addition, it is possible to form the interlayer insulating layer by SOG (Spin-On-Glass).

Here, it is possible to form the interlayer insulating layer 2 by, for example performing the heat treatment under the $N_2$ atmosphere at 400° C. for about 30 min. after coating SOG in about 0.8 μm thick while rotating it.

Thereafter, the interlayer insulating layer 2 is processed in the same manner as in the first embodiment. That is, after forming the wiring groove on the interlayer insulating layer 2, an insulating film having a low F, or C content is formed on the inner wall surface of the wiring groove using, for example, a high density plasma apparatus. Thus, it becomes possible to prevent direct contact between the interlayer insulating layer 2 and the barrier metal layer 5.

In all the embodiments described above, inorganic materials were used for forming the interlayer insulating layer 2. However, in the third embodiment, it is possible to apply the wiring layer in the structure of this invention even when an organic system insulation film is used for an interlayer insulating film having a low dielectric constant. In this case, the organic system insulating film denotes an organic silanol film and/or a polyimide film.

After applying an insulating film material dissolved in organic solvent on a semiconductor substrate, the organic solvent is removed and the insulating film is formed when the heat treatment is applied. Generally, because an organic insulating film contains many active combined radicals, it reacts easily with metals composing the barrier metal layer 5. However, according to the present invention, the insulating layer 4 prevents the direct contact of the interlayer insulating layer 2 with the barrier metal layer 5. Thus, the barrier metal layer 5 is not able to react with the interlayer insulating layer 2.

In the third embodiment, the insulating layer 4 was formed between the interlayer insulation layer 2 which is an organic system insulating film and the barrier metal layer 5. Even when the interlayer insulating layer 2 is an organic system insulating layer, it is possible to prevent the diffusion of wiring material by changing the quality of the surface of the interlayer insulating layer 2 by applying the plasma process as in the second embodiment. When the quality of these films is changed, the defect density of the insulating layer 4 decreases with the dropped content of C. Therefore, even when the area of the quality changed interlayer insulating film is brought in contact with the wiring layer, its reaction with the metal in the wiring material is suppressed and it remains stable.

Further, besides the first, second and third embodiments, as a fourth embodiment, it is possible to insulate between the wiring layers of the interlayer insulating layer 2 having a low dielectric constant using a gas such as CO or $CO_2$.

In this case, a film about 0.8 μm thick is formed from solid C using, for instance, sputter and the wiring groove 3 is formed in this film as in the above-mentioned embodiment. Then, using a high density plasma apparatus, the insulating layer 4 with a low content of F or C is formed on the inner wall surface of this wiring groove 3. Further, in the same manner as in the above-mentioned embodiment, the barrier metal layer 5 and the wiring layer 6 are formed and a second insulating layer 7 is formed on the wiring layer 6 and the interlayer insulating layer 2. The second insulating layer 7 is similar to the first insulating layer 4.

In this embodiment the heat treatment is carried out under the $O_2$ atmosphere at about 400° C. for about 60 min. By this heat treatment, it becomes possible to vaporize the solid C between the first insulating layer 4 and the second insulating layer 7. This vaporization fills the space between the wiring layers with a gas, for instance, $O_2$, CO, $CO_2$, etc. Further, it is also possible to vaporize the solid C between the wiring layers by performing the heat treatment under an $O_2$ plasma atmosphere for about 30 min. In such a structure, where the space between the wiring layers 6 is filled with gas, in order to prevent leakage of the gas, it is necessary to form an insulating film on the upper and lower surfaces of the interlayer insulating layer.

In the above-mentioned embodiments, all the barrier metal layers 5 were formed only on the inner wall surface of the wiring groove 3 and not formed on the upper surface of the wiring layer 6. It is also possible to form a barrier metal layer 5" on the wiring layer 6 as in a fifth embodiment illustrated in FIG. 5. Further, the insulating layer 7 is formed on the barrier metal layer 5" in the some manners as the insulating layer 4.

Such a structure can be manufactured by selectively forming a high melting point metal, for instance, Niobium (Nb) on the wiring layer 6 using, for instance, the CVD process (selective-CVD) after burying the wiring layer 6 in the wiring groove 3 using the CMP process.

Further, it is also possible to manufacture such structure by separating a high melting point metal such as W on the surface of the wiring layer 6 from the barrier metal layer 5, which was formed on the inner wall surface of the wiring groove by performing the heat treatment at 400°–500° C. after burying the wiring layer 6 in the wiring groove 3, as described above.

In general, because the insulating layer 7 with a dense insulating film prevents the diffusion of wiring material from the wiring layer 6, there is no need to form a barrier metal layer on the wiring layer 6. However, the diffusion of Cu from the wiring layer 6 can be prevented more certainly by forming the barrier metal layer 5" on the wiring layer 6 so as to cover the wiring layer 6 by the barrier metal layer.

Figure 1:
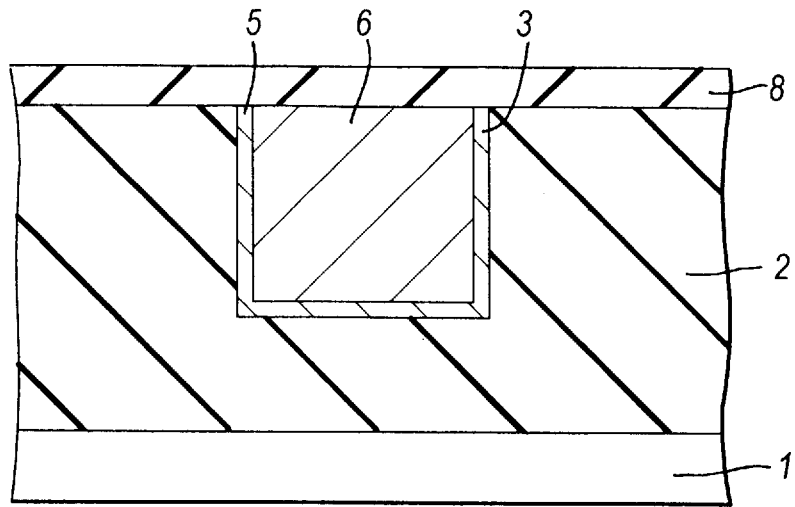
FIG. 1 is a sectional view of a conventional metallization of Cu.
Figure 5:
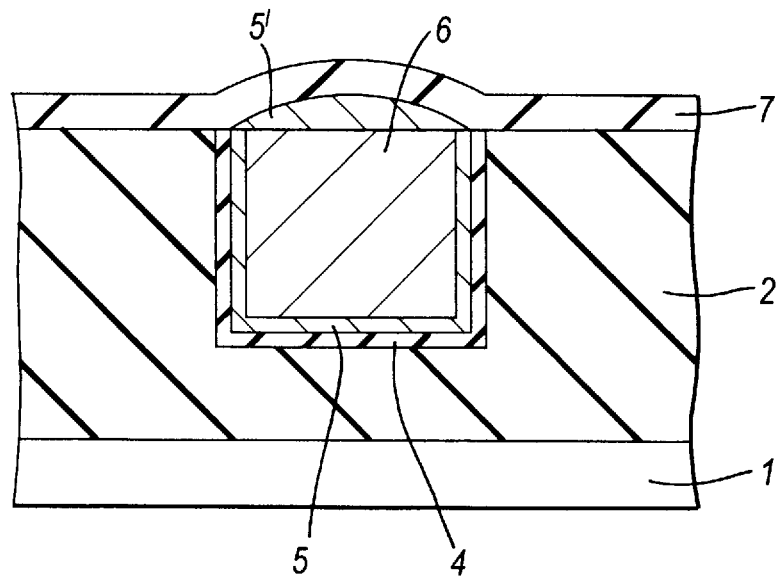
FIG. 5 is a sectional view of a structure of a semiconductor device according to a fifth embodiment.

Further, in a multi-layer wiring structure having more than two wiring layers, an insulating layer 7 is further formed on the barrier metal layer 5" on the wiring layer 6 as illustrated in FIG. 5. The insulating layer 7 prevents the deterioration of the barrier characteristic of the barrier metal layer 5" because a metal composing the barrier metal layer 5" reacts with a combined radical contained in the second interlayer insulating layer.

Further, in the embodiments described above, where Cu or a metal containing Cu is used as material of the wiring layer 6, it is also possible to use other materials if they are highly reliable. For instance, such metals having a high conductivity such as alloys of Al and Cu, Ag, or Au are usable.

In this case, if materials comprising the wiring layer 6 tend to diffuse in the interlayer insulating layer 2, it is possible to secure the barrier characteristic of the barrier metal layer 5 and prevent materials comprising the wiring layer 6 from diffusing into the interlayer insulating layer 2 by covering the wiring layer 6 with the barrier metal layer 5 and forming the insulating layer 4 with materials differing from the interlayer insulating layer 2 between the barrier metal layer 5 and the interlayer insulating layer 2.

Figure 6A:
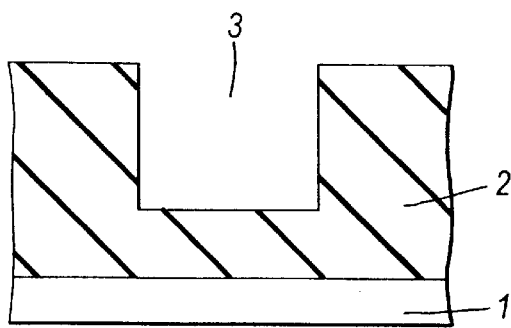
FIGS. 6(a), 6(b), and 6(c) are sectional views of each step of manufacturing a semiconductor device according to a sixth embodiment.
Figure 6B:
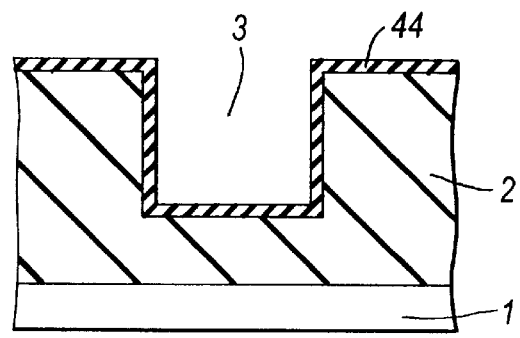
Figure 6C:
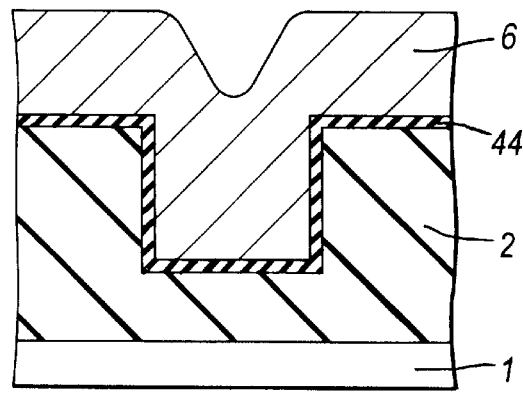

Further, if it is possible to prevent materials comprising the wiring layer 6 from diffusing into the interlayer insulating layer 2 by forming the insulating layer 44 of a material having an extremely small defect density, the barrier metal layer 5 is not necessarily required as illustrated in FIG. 6. As shown in FIG. 6, the wiring layer 6, containing copper, can be formed directly on an oxide insulating layer 44 having a small defect density. The layer 44 is deposited from source gases which do not contain C or F. Because of the low defect density in the layer 44, Cu in the wiring layer 6 does not diffuse into the insulating layer 44 or the insulating layer 2.

Thus, according to the semiconductor device and its manufacturing process of the present invention, an insulating film having a low content of F or C is formed between a barrier metal layer and an interlayer insulating layer having a low dielectric constant, thereby preventing the direct contact of a barrier metal layer with an interlayer insulating layer having a low dielectric constant. Thus, it becomes possible to prevent deterioration of the barrier characteristic of a barrier metal layer and reduce current leakage between wiring layers by suppressing the diffusion of the Cu contained in the wiring layers into the interlayer insulating layer.

While this detailed description has illustrated and described what are presently considered to be the preferred embodiments of the present invention, it will be understood by those skilled in the art that various changes and modifications may be made, and equivalents may be substituted for devices thereof, without departing from the true scope of the invention. In addition, many modifications may be made to adapt a particular situation or material to tho teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

As described above, the insulating layer having a low content of F and C is preferably deposited from source gases which do not include F or C, except as possible trace impurities. Thus, neither F nor C are intentionally added to the insulating layer between the insulating layer with low dielectric constant and the metal wiring layer. Other methods may be used to form this layer as long as the low density of F and C is maintained. While no precise, direct experimental data is currently available, the inventor believe the density of F under such conditions should be less than $1 \times 10^{20}$ cm$^{-3}$ and preferable less than $1 \times 10^{19}$ cm$^{-3}$. In contrast, F and/or C is intentionally added to the layer of low dielectric constant in an amount necessary to produce the low dielectric constant. The electric constant is preferably less than about 3.9.

What is claimed is:

1. A semiconductor device comprising:
    a first insulating layer having a groove in a surface thereof;
    a second insulating layer on a surface of the groove, the second insulating layer having a lower density of crystal defects than the first insulating layer; and
    a wiring layer in the groove, the second insulating layer being between the wiring layer and the surface of the groove,
    wherein the second insulating layer includes carbon or fluorine at a density lower than the first insulating layer.

2. The semiconductor device according to claim 1, wherein a thickness of the second insulating layer is about 50 nm.

3. The semiconductor device according to claim 1, wherein the second insulating layer comprises silicon dioxide or silicon nitride.

4. The semiconductor device according to claim 1, wherein the first insulating layer includes carbon or fluorine in an amount sufficient to lower the dielectric constant of the first insulating layer.

5. The semiconductor device according to claim 4, wherein the dielectric constant of the first insulating layer is less than about 3.9.

6. The semiconductor device according to claim 4, wherein the amount of F or C in the second insulating layer does not influence the dielectric constant of the second insulating layer.

7. The semiconductor device according to claim 1, wherein the wiring layer comprises a metal selected from the group consisting of an alloy of Al and Cu, Ag, and Au.

8. The semiconductor device according to claim 1, wherein the first insulating layer comprises an organic compound.

9. A semiconductor device comprising:
    an interlayer insulating layer having a groove in a surface thereof;
    a first insulating layer on a surface of the groove, the first insulating layer having a density of carbon or fluorine lower than the interlayer insulating layer;
    a barrier metal layer on the first insulating layer;
    a wiring layer in the groove, the barrier metal layer being between the wiring layer and the first insulating layer; and
    a second insulating layer covering an upper surface of the wiring layer.

10. The semiconductor device according to claim 9, wherein a thickness of the first insulating layer is about 50 nm.

11. The semiconductor device according to claim 9, wherein tho first insulating layer comprises silicon dioxide or silicon nitride.

12. The semiconductor device according to claim 9, wherein the wiring layer comprises a metal selected from the group consisting of: an alloy of Al and Cu, Ag, and Au.

13. The semiconductor device according to claim 9, wherein the interlayer insulating layer comprises an organic compound.

14. The semiconductor device according to claim 9, wherein the interlayer insulating layer contains F and/or C in an amount sufficient to lower the dielectric constant of the interlayer insulating layer.

15. A semiconductor device comprising:
- an interlayer insulating layer on a semiconductor substrate, having dielectric constant less than about 3.9;
- a wiring layer buried in a groove in a surface of the interlayer insulating layer; and
- a first insulating layer between the interlayer insulating layer and the wiring layer, the first insulating layer preventing a reaction with the wiring layer, wherein the first insulating layer includes carbon or fluorine at a density lower than the interlayer insulating layer.

16. The semiconductor device according to claim 15, wherein a thickness of the first insulating layer is about 50 nm.

17. The semiconductor device according to claim 15, wherein the first insulating layer comprises silicon dioxide or silicon nitride.

18. The semiconductor device according to claim 15, wherein the interlayer insulating layer contains F and/or C in an amount sufficient to lower the dielectric constant of the interlayer insulating layer.

19. The semiconductor device according to claim 18, wherein dielectric constant of the interlayer insulating layer is less than about 3.9.

20. The semiconductor device according to claim 18, wherein the amount of fluorine or carbon in the first insulating layer does not influence the dielectric constant of the first insulating layer.

21. The semiconductor device according to claim 15, wherein the wiring layer comprises a metal selected from the group consisting of: an alloy of Al and Cu, Ag, and Au.

22. The semiconductor device according to claim 15, wherein the interlayer insulating layer comprises an organic.

23. The semiconductor device according to claim 15, wherein the interlayer insulating layer comprises an inorganic compound.

24. The semiconductor device according to claim 23, wherein the inorganic compound is an insulator made by high-density plasma CVD whose density of plasma is above $1 \times 10^{11}$ cm$^{-3}$.

25. The semiconductor device according to claim 15, wherein the interlayer insulating layer comprises an insulator including an SiF group.

26. The semiconductor device according to claim 15, wherein the interlayer insulating layer comprises a gas sealed between at least two wiring layers.

* * * * *

UNITED STATES PATENT AND TRADEMARK OFFICE
CERTIFICATE OF CORRECTION

PATENT NO.   : 5,850,102
DATED        : December 15, 1998
INVENTOR(S)  : Tadashi Matsuno It is certified that error appears in the above-identified patent and that said Letters Patent is hereby corrected as shown below:

<u>Column 12,</u>
Line 10, insert -- compound -- after "organic".

Signed and Sealed this

Twentieth Day of August, 2002

Attest:

Attesting Officer

JAMES E. ROGAN
Director of the United States Patent and Trademark Office